(12) United States Patent
Tseng et al.

(10) Patent No.: US 10,410,684 B2
(45) Date of Patent: Sep. 10, 2019

(54) MEMORY DEVICE WITH OXIDE SEMICONDUCTOR STATIC RANDOM ACCESS MEMORY AND METHOD FOR OPERATING THE SAME

(71) Applicant: UNITED MICROELECTRONICS CORP., Hsin-Chu (TW)

(72) Inventors: Chun-Yen Tseng, Tainan (TW); Ting-Hao Chang, Hsinchu County (TW); Ching-Cheng Lung, Tainan (TW); Yu-Tse Kuo, Tainan (TW); Shih-Hao Liang, Tainan (TW); Chun-Hsien Huang, Tainan (TW); Shu-Ru Wang, Taichung (TW); Hsin-Chih Yu, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/900,811

(22) Filed: Feb. 21, 2018

(65) Prior Publication Data
US 2019/0221238 A1 Jul. 18, 2019

(30) Foreign Application Priority Data
Jan. 16, 2018 (TW) .............................. 107101599 A

(51) Int. Cl.
*G11C 5/02* (2006.01)
*H01L 27/108* (2006.01)
(Continued)

(52) U.S. Cl.
CPC .............. *G11C 5/02* (2013.01); *G11C 11/409* (2013.01); *G11C 11/419* (2013.01);
(Continued)

(58) Field of Classification Search
CPC ....... G11C 5/02; G11C 11/419; G11C 11/409; H01L 27/1108; H01L 27/1052; H01L 27/10802; H01L 29/7869
See application file for complete search history.

(56) References Cited

U.S. PATENT DOCUMENTS 9,257,173 B2 * 2/2016 Ishizu ................... G11C 11/419
9,385,713 B2 7/2016 Uesugi
(Continued)

OTHER PUBLICATIONS

Chang, Title of Invention: Semiconductor Memory Device, U.S. Appl. No. 15/479,253, filed Apr. 4, 2017.

*Primary Examiner* — David Lam
(74) *Attorney, Agent, or Firm* — Winston Hsu

(57) ABSTRACT

The present invention provides a memory device, the memory device includes a first region having a plurality of oxide semiconductor static random access memories (OSS-RAM) arranged in a first direction, and each of the OSS-RAMs comprising a static random access memory (SRAM) and at least an oxide semiconductor dynamic random access memory (DOSRAM), wherein the DOSRAM is connected to the SRAM, wherein each of the DOSRAMs comprises an oxide semiconductor gate (OSG), and each of the OSGs extending in a second direction perpendicular to the first direction, and an oxide semiconductor channel extending in the first direction, an oxide semiconductor gate connection extending in the first direction to connect each of the OSGs, and a word line, a Vcc connection line and a Vss connection line extend in the first direction and are connected to the SRAMs in each OSSRAM.

20 Claims, 5 Drawing Sheets

(51) Int. Cl.
*H01L 27/105* (2006.01)
*G11C 11/409* (2006.01)
*G11C 11/419* (2006.01)
*H01L 27/11* (2006.01)
*H01L 29/786* (2006.01)

(52) U.S. Cl.
CPC .... *H01L 27/1052* (2013.01); *H01L 27/10802* (2013.01); *H01L 27/1108* (2013.01); *H01L 29/7869* (2013.01)

(56) References Cited

U.S. PATENT DOCUMENTS 9,478,276 B2 10/2016 Onuki
2018/0075886 A1* 3/2018 Ishizu .................... G11C 7/12

* cited by examiner

MEMORY DEVICE WITH OXIDE SEMICONDUCTOR STATIC RANDOM ACCESS MEMORY AND METHOD FOR OPERATING THE SAME

BACKGROUND OF THE INVENTION

1. Field of the Invention

The invention relates to a semiconductor device, and more particularly, to a semiconductor memory device and the operating method thereof.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

The present invention provides a memory device, the memory device includes a first region having a plurality of oxide semiconductor static random access memories (OSS-RAM) arranged in a first direction, and each of the OSS-RAMs comprising a static random access memory (SRAM) and at least an oxide semiconductor dynamic random access memory (DOSRAM), the DOSRAM is connected to the SRAM, each of the DOSRAMs comprises an oxide semiconductor gate (OSG), and each of the OSGs extending in a second direction perpendicular to the first direction, and an oxide semiconductor channel extending in the first direction, an oxide semiconductor gate connection extending in the first direction to connect each of the OSGs, and a word line, a Vcc connection line and a Vss connection line extend in the first direction and are connected to the SRAMs in each OSSRAM.

The present invention further provides a method of operating a memory device, the method comprising: Firstly, a memory device is provided, the memory device comprising: a first region having a plurality of oxide semiconductor static random access memories (OSSRAMs) arranged in a first direction, and each of the OSSRAMs comprising a static random access memory (SRAM) and at least an oxide semiconductor dynamic random access memory (DOSRAM), the DOSRAM is connected to the SRAM, and each DOSRAM stores a first potential value, each of the DOSRAMs comprises an oxide semiconductor gate (OSG), and each of the OSG extending in a second direction perpendicular to the first direction, and an oxide semiconductor channel (OS channel region) extending in the first direction, an oxide semiconductor gate connection (OSG connection) extending in the first direction to connect each of the OSGs, and a word line, a Vcc connection line and a Vss connection line extend in the first direction and are connected to the SRAMs in each OSSRAM, and a second region parallel to the first region having a plurality of second oxide semiconductor static random access memories (second OSSRAMs) arranged in the first direction, and each of the second OSSRAMs comprising a second static random access memory (second SRAM) and at least a second oxide semiconductor dynamic random access memory (second DOS-RAM), the second DOSRAM is connected to the second SRAM, and each second DOSRAM stores a second potential value, each of the second DOSRAMs comprises a second oxide semiconductor gate (second OSG), and each of the second OSGs extending in the second direction, and a second oxide semiconductor channel (second OS channel region) extending in the first direction, a second oxide semiconductor gate connection (second OSG connection) extending in the first direction to connect each of the second OSGs; and a second word line, a second Vcc connection line and a second Vss connection line extend in the first direction and are connected to the second SRAMs in each second OSSRAM. Next, the word line and the OSG connection in the first region are operated, to read the first potential value stored in the DOSRAMs of all OSSRAMs in the first region. Afterwards, the second word line and the second OSG connection in the second region are operated, to read the second potential value stored in the second DOSRAMs of all second OSSRAMs in the second region after the word line and the OSG connection in the first region are operated.

The present invention provides a layout pattern of an oxide semiconductor static random access memory (OSS-RAM), it comprises a static random access memory (SRAM) connected to at least an oxide semiconductor dynamic random access memory (DOSRAM). The invention is characterized in that the word line, the Vcc connection line and the Vss connection line of the SRAM and the OS channel region of the DOSRAM are parallel to each other. As a result, SRAM and DOSRAM are stacked more area between each other, thereby reducing the overall area of the memory device. In addition, this layout can operate single or multiple rows of OSSRAM at a same time, and by reading the stored potential value of each OSSRAM in stages, the system current consumption can be controlled within a certain range.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
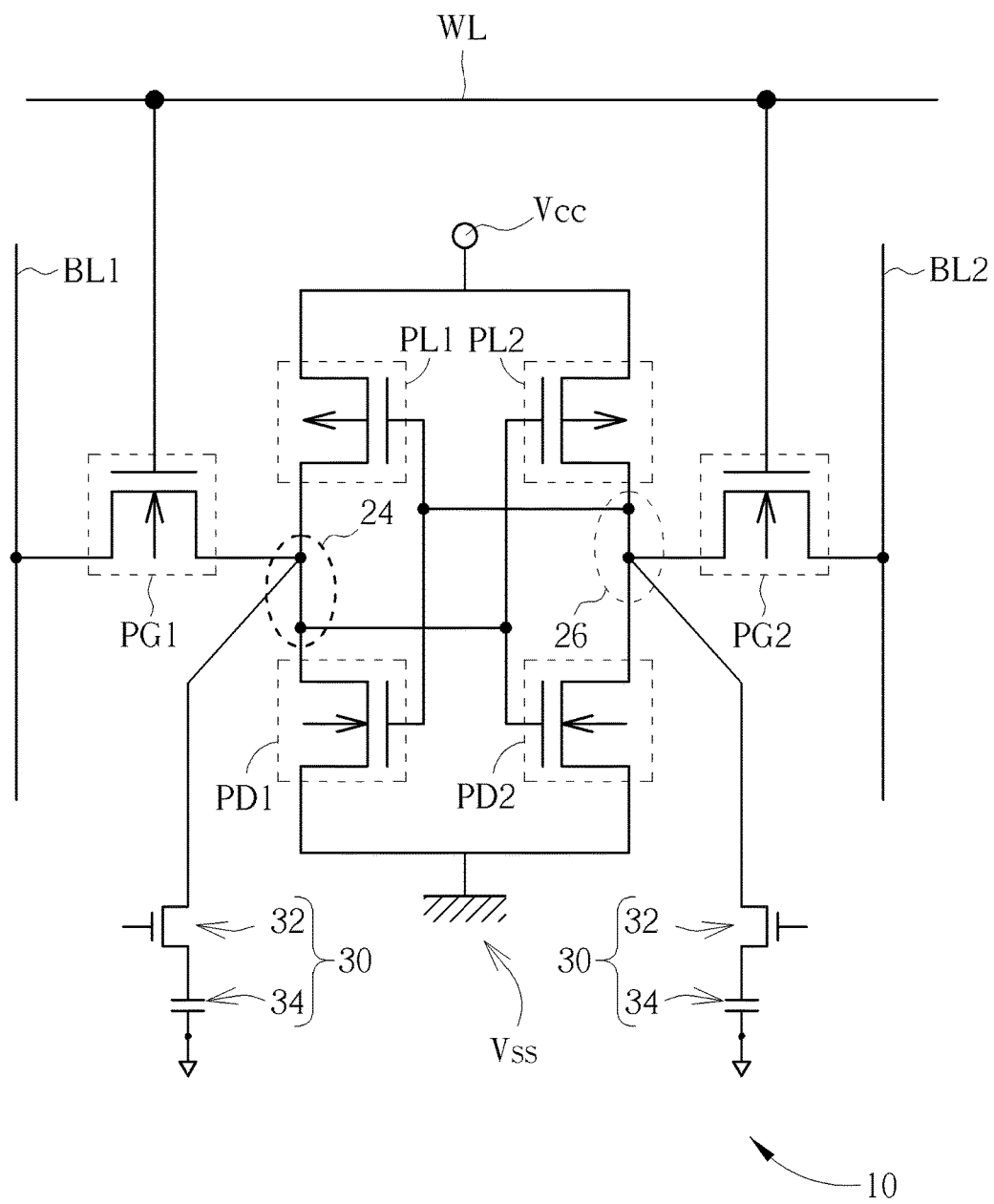
FIG. 1 illustrates a circuit diagram of a six-transistor SRAM (6T-SRAM) cell which is electrically connected to two oxide semiconductor dynamic random access memories (DOSRAMs) to form an oxide semiconductor static random access memory (OSSRAM) according to a first preferred embodiment of the present invention.

As shown in FIG. 1, FIG. 1 illustrates a circuit diagram of a six-transistor SRAM (6T-SRAM) cell which is electrically connected to two oxide semiconductor dynamic random access memories (DOSRAMs) to form an oxide semiconductor static random access memory (OSSRAM) according to a first preferred embodiment of the present invention. Briefly, the present invention provides a memory cell including two dynamic random access memory (DRAM) connecting one static random access memory (SRAM), since the DRAM includes an oxide semiconductor material as a channel material, so the combined device of an oxide semiconductor DRAM and an SRAM is defined as an oxide semiconductor static random access memory (OSSRAM) for short. The SRAM cell comprises one six transistors SRAM (6T-SRAM). However, it should be noted that in other embodiments of the present invention, the SRAM cell is not limited to 6T-SRAM, and may include such as 8T-SRAM, 10T-SRAM or more transistors SRAM cell. The following paragraphs still take 6T-SRAM as an example.

Please refer to FIG. 1, in this embodiment, each 6T-SRAM cell 10 is composed of a first pull-up transistor PL1, a second pull-up transistor PL2, a first pull-down transistor PD1, a second pull-down transistor PD2, a first access transistor PG1 and a second access transistor PG2. These six devices (transistors) constitute a set of flip-flops. The first and the second pull-up transistors PL1 and PL2, and the first and the second pull-down transistors PD1 and PD2 constitute a latch circuit that stores data in the storage nodes 24 and 26. Since the first and the second pull-up transistors PL1 and PL2 act as power load devices, they can be replaced by resistors. Under this circumstance, the static random access memory becomes a four-transistor SRAM (4T-SRAM). In this embodiment, the first and the second pull-up transistors PL1 and PL2 preferably share a source/drain region and electrically connect to a voltage source (voltage node) Vcc, and the first and the second pull-down transistors PD1 and PD2 share a source/drain region and electrically connect to a voltage source (voltage node) Vss.

Preferably, the first and the second pull-up transistors PL1 and PL2 of the 6T-SRAM cell 10 are composed of p-type metal oxide semiconductor (PMOS) transistors; the first and the second pull-down transistors PD1 and PD2, the first access transistors PG1 and the second access transistors PG2 composed of n-type metal oxide semiconductor (NMOS) transistors, but not limited thereto. The first pull-up transistor PL1 and the first pull-down transistor PD1 constitute an inverter, which further forma series circuit. One end of the series circuit is connected to a voltage source Vcc and the other end of the series circuit is connected to a voltage source Vss. Similarly, the second pull-up transistor PL2 and the second pull-down transistor PD2 constitute another inverter and a series circuit. One end of the series circuit is connected to the voltage source Vcc and the other end of the series circuit is connected to the voltage source Vss. The two inverters are cross-coupled to each other to store data.

Besides, the storage node 24 is connected to the respective gates of the second pull-down transistor PD2 and the second pull-up transistor PL2. The storage node 24 is also connected to the drains of the first pull-down transistor PD1, the first pull-up transistor PL1 and the first access transistor PG1. Similarly, the storage node 26 is connected to the respective gates of the first pull-down transistor PD1 and first the pull-up transistor PL1. The storage node 26 is also connected to the drains of the second pull-down transistor PD2, the second pull-up transistor PL2 and the second access transistor PG2. The gates of the first access transistor PG1 and the second access transistor PG2 are respectively coupled to a word line (WL); the source of the first access transistor PG1 and the second access transistor PG2 are respectively coupled to a first bit line (BL1) and a second bit line (BL2).

In addition, in the present invention, the 6T-SRAM cell 10 is electrically connected to two oxide semiconductor dynamic random access memories (hereinafter referred to as DOSRAM) 30, which are electrically connected to the storage node 24 and the storage node 26 respectively. Besides, in other embodiments of the present invention, it may also include only one DOSRAM 30 and be connected to the storage node 24 or the storage node 26 of the 6T-SRAM memory cell 10, which is also within the scope of the present invention.

Figure 2A:
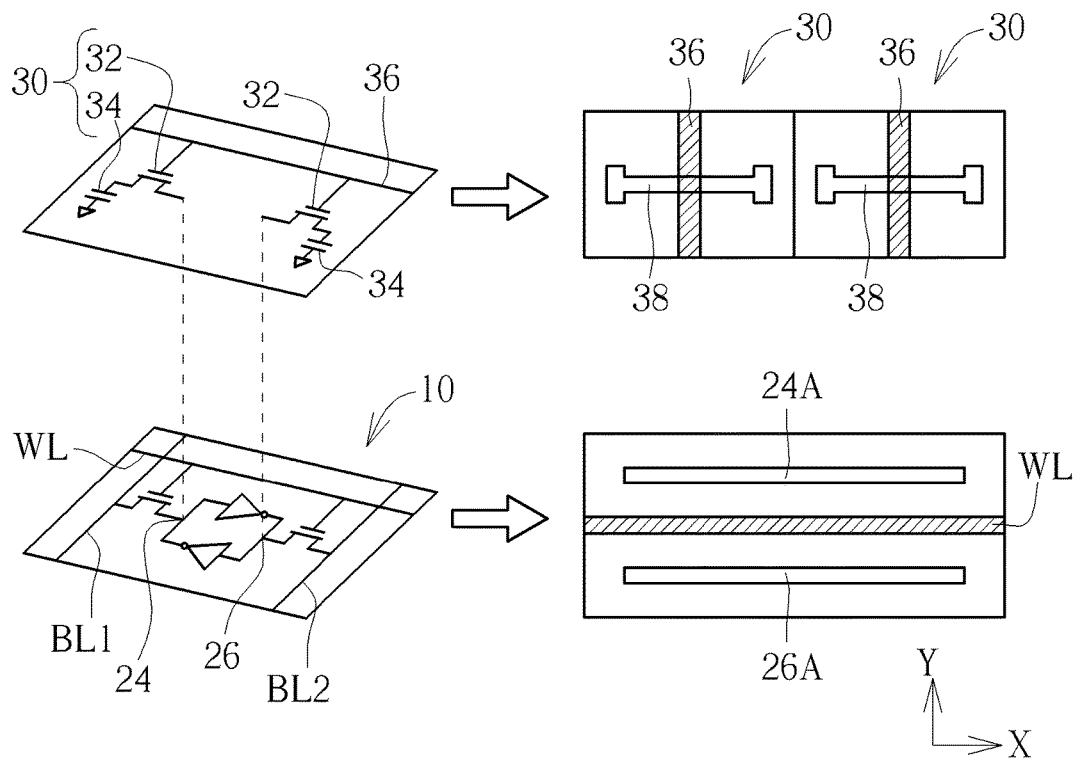
FIG. 2A illustrates a stacking situation of a 6T-SRAM memory cell and a DOSRAM in an embodiment of the present invention.

In actual production, the DOSRAM 30 is preferably fabricated in the structure that disposed above the 6T-SRAM memory cell 10. In other words, the 6T-SRAM memory cell 10 is formed before the DOSRAM 30 is manufactured. Since the DOSRAMs 30 are stacked on the 6T-SRAM memory cell 10, the overlapping area between them is larger, so that the area of the whole memory cell can be reduced. In more detail, please refer to FIG. 2A, which illustrates a stacking situation of a 6T-SRAM memory cell and a DOSRAM in an embodiment of the present invention. The left half shows the circuit diagram of the stacking situation, the right half shows the corresponding layout. First, to simplify the illustration, each DOSRAM 30 only draws the gate and channel regions of the OSFET 32, which are respectively an oxide semiconductor gate (OSG) 36 and an oxide semiconductor channel (OS channel region) 38, the OSG 36 is preferably perpendicular to the OS channel region 38. In addition, the OS channel region 38 is made of an oxide semiconductor material, for example, indium gallium zinc oxide (IGZO), but is not limited thereto. While the 6T-SRAM memory cell 10 simply indicates the positions of the word line WL, the bit line BL1, the bit line BL2, the storage node connection 24A (which is connected to the storage node 24) and the storage node connection 26A (which is connected to the storage node 26). As shown in FIG. 2A, the layout pattern of the 6T-SRAM memory cell 10 has a rectangular shape with a long side parallel to the extending direction of the word line WL. On the other hand, the layout pattern of the DOSRAM 30 also has a rectangular shape, in which long sides are parallel to the extending direction of the OS channel region 38. In this case, if the long sides of the two DOSRAMs and the long side of the 6T-SRAM memory cell 10 are disposed parallel to each other as shown in FIG. 2A, in other words, the direction of the OS channel region 38 is parallel to the direction of the word line WL, the memory device has more overlapping area, thereby reducing the overall area of the memory device.

Figure 2B:
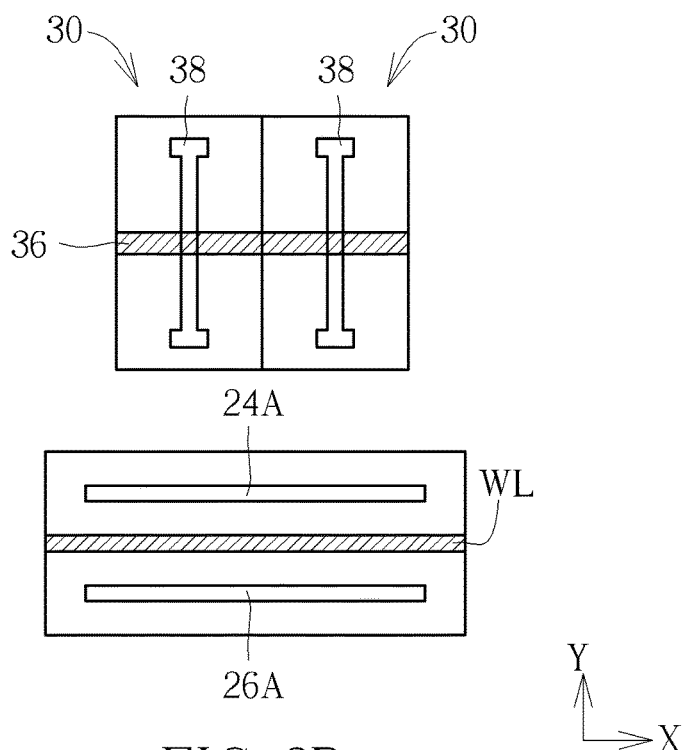
FIG. 2B illustrates a stacking situation of a 6T-SRAM memory cell and a DOSRAM in another embodiment of the present invention.

In another case, as shown in FIG. 2B, a stacking of a 6T-SRAM memory cell and a DOSRAM in another embodiment of the present invention is shown. If the direction of the OS channel region 38 and the direction of the word lines WL are not parallel, for example, set to be perpendicular to each other, the overlapping area between the DOSRAM 30 and the 6T-SRAM memory cell 10 is smaller, which is less advantageous for reducing the overall area of the memory device.

Therefore, in order to reduce the area of the memory device of the present invention, in the layout pattern of the present invention, preferably if the word line WL of the 6T-SRAM memory cell 10 is disposed along a first direction (e.g., the X axis), then the oxide semiconductor channel 38 should also be arranged along the first direction, while the oxide semiconductor gate 36 should be disposed along a second direction (e.g., Y-axis). The first direction and the second direction are perpendicular to each other.

Figure 3:
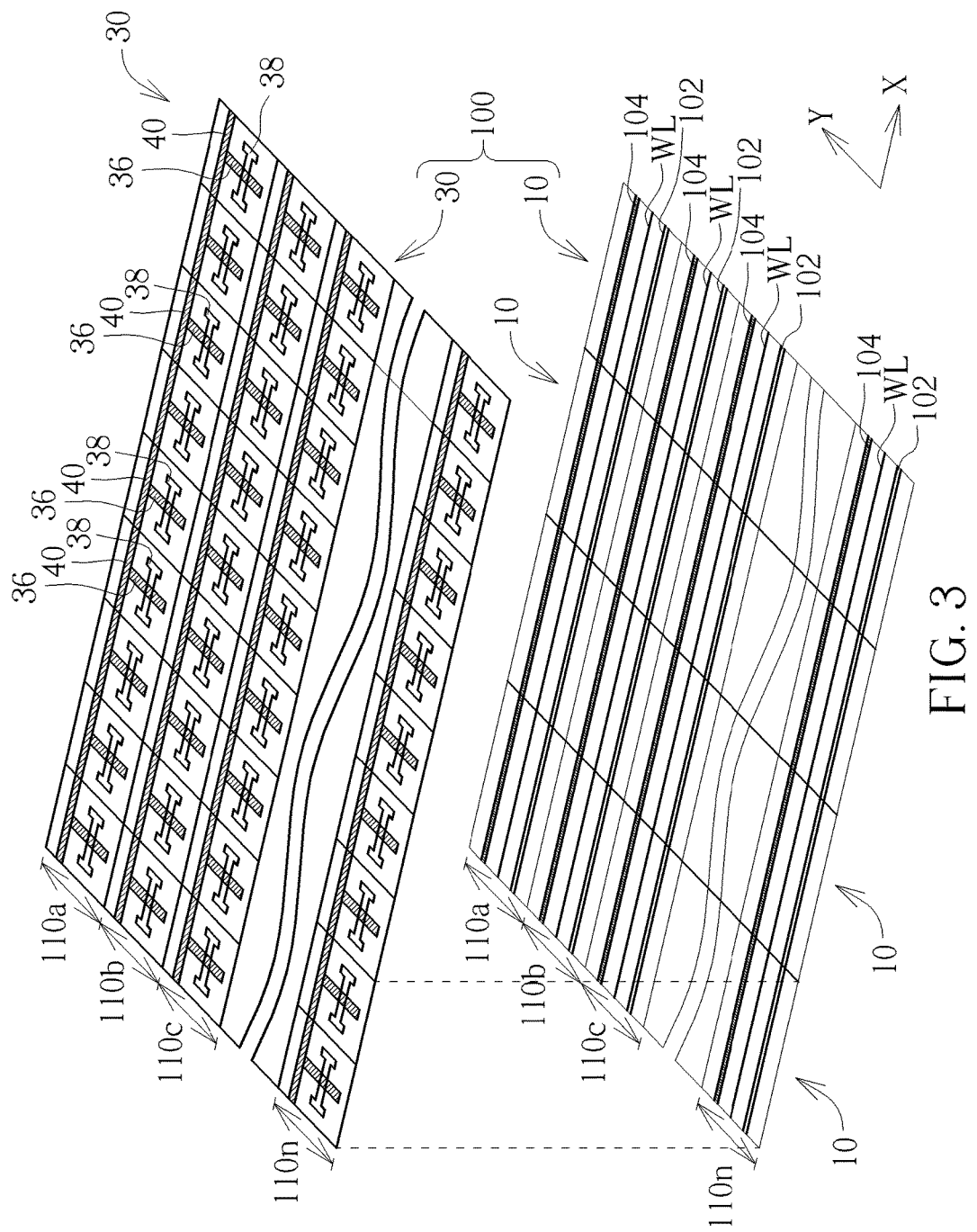
FIG. 3 shows an array of multiple OSSRAMs 100 of the present invention.

FIG. 3 shows an array of multiple OSSRAMs 100 of the present invention. The OSSRAM 100 includes a 6T-SRAM memory cell 10 located in the lower layer and a DOSRAM 30 located in the upper layer. In order to simplify the illustration, the 6T-SRAM memory cell 10 located in the lower layer only draws the word line WL, a Vcc connection line 102 and a Vss connection line 104. Each WL passes through a plurality of 6T-SRAM memory cells 10 arranged along a first direction (e.g., X axis), the Vcc connection lines 102 are connected between the voltage source Vcc and each of the 6T-SRAM memory cells 10, and the Vss connection lines 104 are connected to the voltage source Vss and each of the 6T-SRAM memory cells 10. Similarly, the Vcc connection lines 102 and the Vss connection lines 104 also pass through a plurality of 6T-SRAM memory cells 10 arranged in the first direction.

To simplify the illustration, the upper DOSRAM 30 also only depicts the OSGs 36, the OS channel regions 38, and an oxide semiconductor gate connection (OSG connection) 40 connecting each of the OSGs 36. As described above, in order to reduce the area of the overall memory device, the OSGs 36 should be arranged in the second direction (Y-axis) so that the OS channel regions 38 are arranged in the first direction, the OSG connections 40 connect the each of the OSGs 36 respectively, and are arranged along the first direction. Therefore, in the present invention, the OSG connection 40, the word line WL, the Vcc connection line 102 and the Vss connection line 104 are all arranged in the first direction. That is, each of the above elements simultaneously connects all the OSSRAMs 100 in the same row arranged in the first direction.

In actual operation of the memory device, in order to simultaneously read values stored in a plurality of elements, for example, reading the values of all the OSSRAMs 100 in a same row in the first direction at the same time, the OSG connection 40, the word line WL, the Vcc connection line 102 and the Vss connection line 104 can simultaneously read or respond to all the OSSRAMs 100 located in the same row. As a result, the reading speed of the memory device can be improved.

In addition, the values read from the OSSRAM 100 of the present invention are listed in rows. That is to say, an operation process will read all the values of all the OSSRAMs 100 in one row. For example, the array formed by the OSSRAM 100 shown in FIG. 3 includes the first row 110a, the second row 110b, the third row 110c, . . . to the $N^{th}$ row 110n. Each row includes a plurality of OSSRAMs 100 arranged along a first direction, and each of the OSSRAMs 100 stores a respective potential value. In addition, the OSG connections 40, the word lines WL, the Vcc connection lines 102 and the Vss connection lines 104 arranged in the first direction also pass through the row. When the OSG connection 40 and the word line WL of the first row are operated and the potential values stored in the respective OSSRAMs 100 in the first row are read, the OSG connections and word lines of the other rows are not operated. After all the values of the OSSRAM 100 in the first row are read, the process of reading the value of the second row of the OSSRAM 100 starts, and the potentials of the respective OSSRSAMs in the second row are read. Then, the third row is sequentially processed until the N rows of numerical read. In other words, reading all the values stored in the OSSRAM 100 in the array requires multiple reading steps. Each reading step at least includes operating the OSG connection 40 and the word line WL in the row.

In addition, the methods for controlling the OSG connection and the word lines to read the values of the OSSRAM are known in the art. For example, reference may be made to U.S. Pat. No. 9,385,713, which will not be further described herein.

The difference between the present invention and the prior art is that the OSSRAM 100 for an array is read in different steps. According to the applicant's experiment, the greater the number of OSSRAMs 100 read each time, the more current energy is consumed by the system when it is read. So if many OSSRAMs 100 are read at a same time, too much power will be consumed during the reading step. Therefore, the present invention reads the values of the same array of OSSRAMs 100 in different steps, which can reduce overall energy loss during the reading step.

The following description will detail the different embodiments of the memory device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 4A:
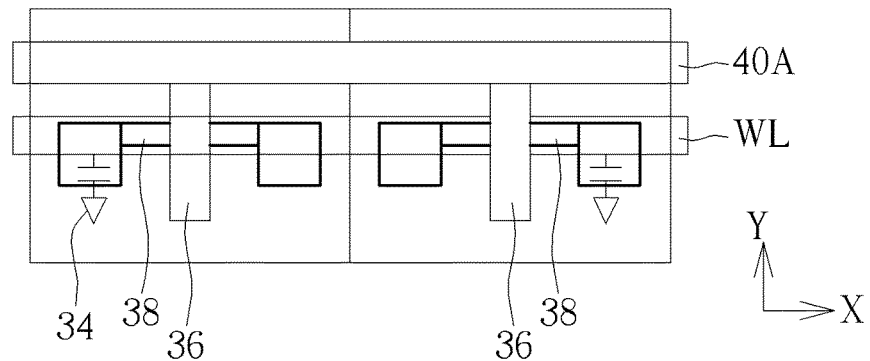
FIG. 4A, FIG. 4B and FIG. 4C respectively illustrate the layout diagrams of different DOSRAM cells according to the present invention.
Figure 4B:
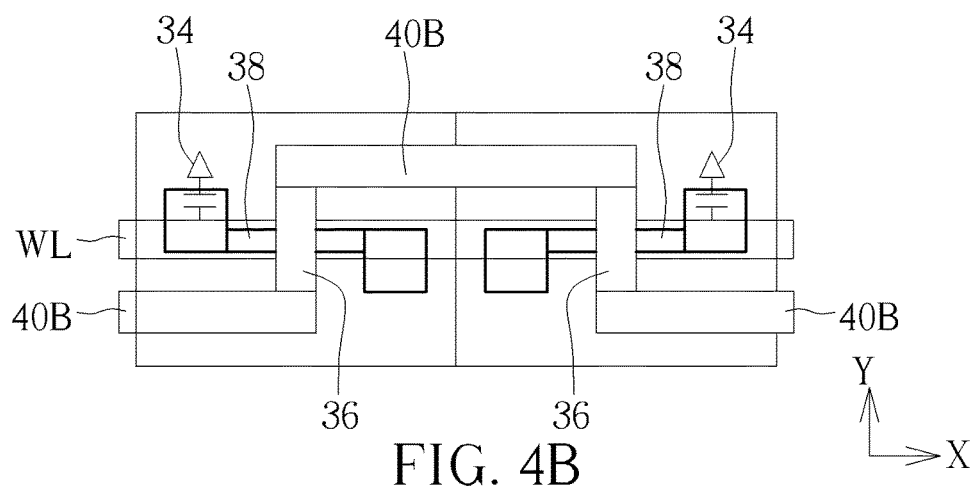
Figure 4C:
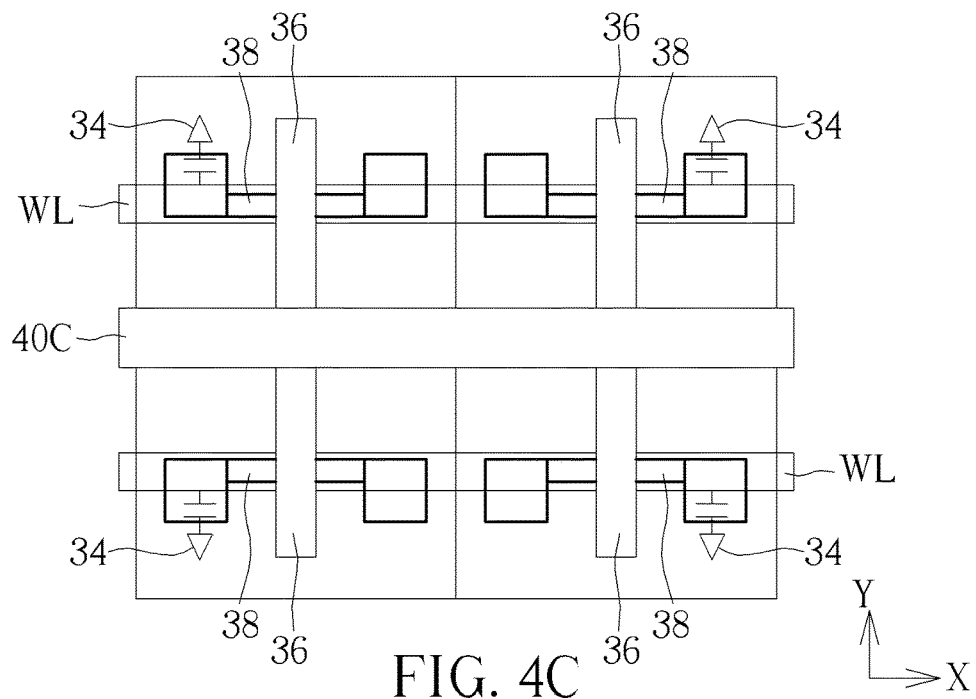

As shown in FIG. 4A, FIG. 4B and FIG. 4C, which respectively illustrate the layout of different DOSRAM cells according to the present invention. Similarly, for simplicity of illustration, each DOSRAM cell only depicts the positions of the OSG 36, the OS channel region 38, the OSG connection and the relative word line WL. The remaining components, including the 6T-SRAM memory cell, are not shown in the figure. As shown in FIG. 4A, the OS channel regions 38 are arranged in the first direction, and two OSGs 36 are arranged in the second direction across the two OSG channel regions 38 respectively. In addition, the OSG connection 40A is located on one side (for example, the positive Y direction) of the OS channel region 38, connects the two OSGs 36, and is arranged along the first direction.

In another embodiment, as shown in FIG. 4B, a portion of the OSG connection 40B is located on one side (e.g., the positive Y direction) of the OS channel region 38, and the rest portion is located on the other side of the OS channel region 38 (e.g., the negative Y direction), the OSG connection 40B are also arranged along the first direction.

In another embodiment, as shown in FIG. 4C, two word lines WL and four DOSRAM cells are included. Each of the DOSRAMs includes an OSG 36 crossing an OS channel region. The OSG connections 40C are arranged in the first direction between the two word lines WL, and connecting the four OSGs 36 disposed on two sides of the OSG connections 40C. In other words, in this embodiment, two rows of DOSRAMs share one same OSG connection 40C.

Figure 5:
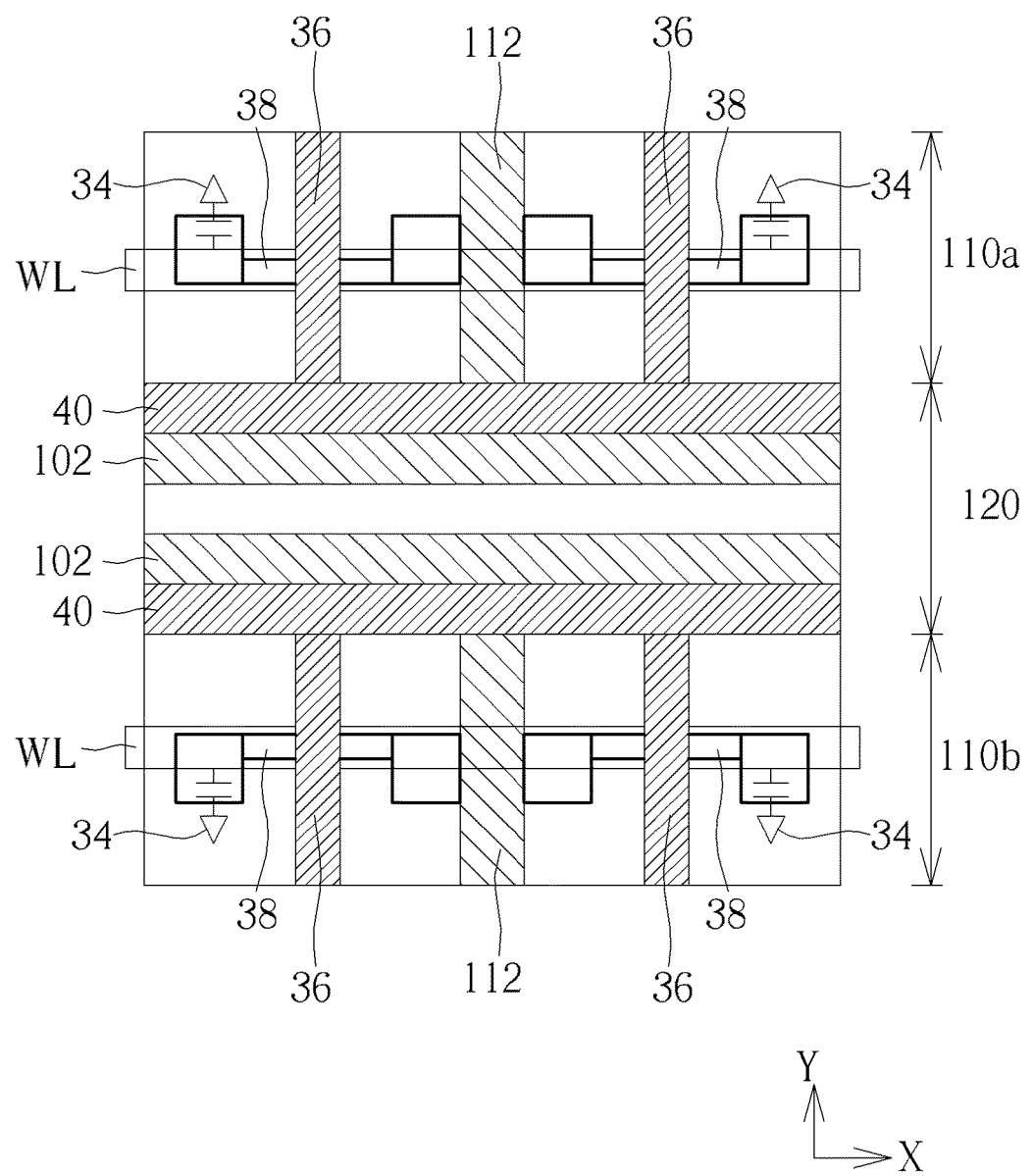
FIG. 5 shows a layout diagram of a DOSRAM stacking on a 6T-SRAM memory cell according to another preferred embodiment of the present invention

As shown in FIG. 5, a layout diagram of a DOSRAM stacking on a 6T-SRAM memory cell according to another preferred embodiment of the present invention is shown. In order to simplify the illustration, the Vcc connection line 102, the word line WL and a Vcc connection 112 connecting the SRAM and the Vcc connection line 102 are only depicted in the embodiment of the 6T-SRAM memory cell. The Vcc connection 112 is, for example, a contact structure, connected to the 6T-SRAM memory cell and connected to the Vcc connection line 102. The present embodiment is characterized in that gap cells are further included between OSSRAMs of different rows. In more detail, in this embodiment, a gap cell region 120 is included between the first row 110a and the second row 110b, and the gap cell region 120 is also arranged along the first direction (X-axis). The gap cell region 120 electrically isolates the OSSRAM of the first row from the OSSRAM of the second row. In addition, in this embodiment, some of the elements may be accommodated within the gap cell region 120. For example, the OSG connection 40 and the Vcc connection line 102 are disposed within the gap cell region 120. In this way, although the Vcc connection 112 is disposed within the range of the first row 110a, but the Vcc connection line 102 does not need to be disposed within the range of the first row 110a. Therefore, the number of components included in the first row 110a can be reduced, thereby reducing the area. Similarly, a Vss connection line (not shown) may be disposed within the gap cell region 120.

In summary, the present invention provides a layout pattern of an oxide semiconductor static random access memory (OSSRAM), it comprises a static random access memory (SRAM) connected to at least an oxide semiconductor dynamic random access memory (DOSRAM). The invention is characterized in that the word line, the Vcc connection line and the Vss connection line of the SRAM and the OS channel region of the DOSRAM are parallel to each other. As a result, SRAM and DOSRAM are stacked more area between each other, thereby reducing the overall area of the memory device. In addition, this layout can operate single or multiple rows of OSSRAM at a same time, and by reading the stored potential value of each OSSRAM in stages, the system current consumption can be controlled within a certain range.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
a first region having a plurality of oxide semiconductor static random access memories (OSSRAMs) arranged in a first direction, and each of the OSSRAMs comprising a static random access memory (SRAM) and at least an oxide semiconductor dynamic random access memory (DOSRAM), wherein each DOSRAM is connected to the SRAM, wherein each of the DOSRAMs comprises an oxide semiconductor gate (OSG), and each of the OSGs extending in a second direction perpendicular to the first direction, and an oxide semiconductor channel (OS channel region) extending in the first direction;
an oxide semiconductor gate connection (OSG connection) extending in the first direction to connect each of the OSGs; and
a word line, a Vcc connection line and a Vss connection line extend in the first direction and are connected to the SRAMs of each OSSRAM.

2. The memory device of claim 1, wherein each DOSRAM includes an oxide semiconductor field effect transistor (OSFET) and a capacitor, the OSG is a gate of the OSFET.

3. The memory device of claim 2, wherein the OSFET and the SRAM are located in different layer structures, and the OSFET is located above the SRAM.

4. The memory device of claim 1, wherein the OSG crosses over the OS channel region.

5. The memory device of claim 1, wherein a material of the OS channel region comprises indium gallium zinc oxide (IGZO).

6. The memory device of claim 1, further comprising a second region parallel to the first region, the second region comprising:
a plurality of second oxide semiconductor static random access memories (second OSSRAMs) arranged along the first direction, and each of the second OSSRAMs includes a second static random access memory (second SRAM) and at least one second oxide semiconductor dynamic random access memory (second DOSRAM); and
a second word line, a second Vcc connection line, and a second Vss connection line extend in the first direction and are connected to the second SRAMs in each second OSSRAM.

7. The memory device of claim 6, wherein the second DOSRAM is connected to the second SRAM, each of the second DOSRAMs comprises a second oxide semiconductor gate (second OSG), each second OSG extends along the second direction, and a second oxide semiconductor channel (second OS channel region) extends in the first direction.

8. The memory device of claim 7, wherein the second region further includes a second oxide semiconductor gate connection (second OSG connection) extending along the first direction and connecting the second OSG.

9. The memory device of claim 6, further comprises a gap cell region located between the first region and the second region, wherein the gap cell region extends along the first direction.

10. The memory device of claim 9, wherein the OSG connection is located in the first region or in the gap cell region.

11. The memory device of claim 9, wherein the Vcc connection line and the Vss connection line are located in the first region or in the gap cell region.

12. The memory device of claim 1, wherein the first region further comprises a plurality of Vcc contact structures connected to the Vcc connection line and the SRAM, and wherein each Vcc contact structure is not located in the gap cell region.

13. The memory device of claim 1, wherein the SRAM includes a six-transistor static random access memory (6T-SRAM).

14. A method of operating a memory device, comprising:
providing a memory device, the memory device comprising:
a first region having a plurality of oxide semiconductor static random access memories (OSSRAMs) arranged in a first direction, and each of the OSSRAMs comprising a static random access memory (SRAM) and at least an oxide semiconductor dynamic random access memory (DOSRAM), wherein the DOSRAM is connected to the SRAM, and each DOSRAM stores a first potential value, wherein each of the DOSRAMs comprises an oxide semiconductor gate (OSG), and each of the OSG extending in a second direction perpendicular to the first direction, and an oxide semiconductor channel (OS channel region) extending in the first direction;

an oxide semiconductor gate connection (OSG connection) extending in the first direction to connect each of the OSGs; and a word line, a Vcc connection line and a Vss connection line extend in the first direction and are connected to the SRAMs in each OSSRAM;

a second region parallel to the first region having a plurality of second oxide semiconductor static random access memories (second OSSRAMs) arranged in the first direction, and each of the second OSSRAMs comprising a second static random access memory (second SRAM) and at least a second oxide semiconductor dynamic random access memory (second DOSRAM), wherein the second DOSRAM is connected to the second SRAM, and each second DOSRAM stores a second potential value, wherein each of the second DOSRAMs comprises a second oxide semiconductor gate (second OSG), and each of the second OSGs extending in the second direction, and a second oxide semiconductor channel (second OS channel region) extending in the first direction;

a second oxide semiconductor gate connection (second OSG connection) extending in the first direction to connect each of the second OSGs; and a second word line, a second Vcc connection line and a second Vss connection line extend in the first direction and are connected to the second SRAMs in each second OSSRAM;

operating the word line and the OSG connection in the first region, to read the first potential value stored in the DOSRAMs of all OSSRAMs in the first region; and operating the second word line and the second OSG connection in the second region, to read the second potential value stored in the second DOSRAMs of all second OSSRAMs in the second region after the word line and the OSG connection in the first region are operated.

15. The method of claim 14, wherein when the word line and the OSG connection in the first region are operated, the second word line and the second OSG connection in the second region are not operated.

16. The method of claim 14, wherein each DOSRAM includes an oxide semiconductor field effect transistor (OSFET) and a capacitor, the OSG is a gate of the OSFET.

17. The method of claim 16, wherein the OSFET and the SRAM are located in different layer structures, and the OSFET is located above the SRAM.

18. The method of claim 14, wherein the OSG crosses over the OS channel region.

19. The method of claim 14, wherein a material of the OS channel region comprises indium gallium zinc oxide (IGZO).

20. The method of claim 14, further comprises providing a gap cell region located between the first region and the second region, wherein the gap cell region extends along the first direction.

* * * * *